United States Patent
Taniguchi et al.

(10) Patent No.: US 9,646,979 B2
(45) Date of Patent: May 9, 2017

(54) NON-VOLATILE SEMICONDUCTOR STORAGE DEVICE

(71) Applicant: Floadia Corporation, Kodaira-shi, Tokyo (JP)

(72) Inventors: Yasuhiro Taniguchi, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 0 days.

(21) Appl. No.: 14/647,009

(22) PCT Filed: Oct. 31, 2013

(86) PCT No.: PCT/JP2013/079512
§ 371 (c)(1),
(2) Date: May 22, 2015

(87) PCT Pub. No.: WO2014/083997
PCT Pub. Date: Jun. 5, 2014

(65) Prior Publication Data
US 2015/0311219 A1    Oct. 29, 2015

(30) Foreign Application Priority Data
Nov. 27, 2012   (JP) ................. 2012-259128

(51) Int. Cl.
*H01L 27/108* (2006.01)
*H01L 29/94* (2006.01)
(Continued)

(52) U.S. Cl.
CPC .... *H01L 27/11521* (2013.01); *G11C 14/0063* (2013.01); *G11C 16/0441* (2013.01);
(Continued)

(58) Field of Classification Search
CPC .................................................. H01L 27/11521
(Continued)

(56) References Cited

U.S. PATENT DOCUMENTS

| 4,652,897 A | 3/1987 | Okuyama et al. |
| 5,029,132 A | 7/1991 | Arakawa |

(Continued)

FOREIGN PATENT DOCUMENTS

| JP | S64-14798 A | 1/1989 |
| JP | H07-60864 B2 | 6/1995 |

(Continued)

OTHER PUBLICATIONS

International Search Report for Corresponding Application No. PCT/JP2013/079512.

*Primary Examiner* — Igwe U Anya
(74) *Attorney, Agent, or Firm* — Pearne & Gordon LLP

(57) ABSTRACT

To propose a non-volatile semiconductor memory device capable of injecting charge into a floating gate by source side injection even in a single-layer gate structure. In a non-volatile semiconductor memory device (1), while each of the memory transistor (MGA1) and the switch transistor (SGA) is made to have a single-layer gate structure, when a selected memory cell (3a) is turned on by applying a high voltage to one end of a memory transistor (MGA1) from a source line (SL) during data programming and applying a low voltage to one end of the switch transistor (SGA) from a bit line (BL1), a voltage drop occurs in a low-concentration impurity extension region (ET2) in the memory transistor (MGA1) between the source line (SL) and the bit line (BL1) to generate an intense electric field, and charge can be injected into the floating gate (FG) by source side injection using the intense electric field.

11 Claims, 11 Drawing Sheets

(51) Int. Cl.
*H01L 27/11521* (2017.01)
*H01L 29/788* (2006.01)
*H01L 27/11* (2006.01)
*H01L 27/11524* (2017.01)
*H01L 27/11529* (2017.01)
*H01L 27/11558* (2017.01)
*G11C 16/04* (2006.01)
*G11C 14/00* (2006.01)
*H01L 27/1156* (2017.01)
*H01L 29/36* (2006.01)

(52) U.S. Cl.
CPC ...... *H01L 27/1104* (2013.01); *H01L 27/1116* (2013.01); *H01L 27/1156* (2013.01); *H01L 27/11524* (2013.01); *H01L 27/11529* (2013.01); *H01L 27/11558* (2013.01); *H01L 29/36* (2013.01); *H01L 29/788* (2013.01); *H01L 29/7881* (2013.01)

(58) Field of Classification Search
USPC .......................................................... 257/300
See application file for complete search history.

(56) References Cited

U.S. PATENT DOCUMENTS

| | | | | |
|---|---|---|---|---|
| 5,181,188 A | * | 1/1993 | Yamauchi | G11C 14/00 257/298 |
| 5,331,188 A | * | 7/1994 | Acovic | G11C 14/00 257/298 |
| 6,114,724 A | * | 9/2000 | Ratnakumar | G11C 16/0433 257/314 |
| 6,255,691 B1 | * | 7/2001 | Hashimoto | H01L 21/28273 257/315 |
| 6,335,880 B2 | * | 1/2002 | Kato | 257/E21.682 |
| 8,674,422 B2 | * | 3/2014 | Horch | H01L 29/66825 257/296 |
| 9,001,580 B1 | * | 4/2015 | Horch | H01L 27/11521 365/149 |
| 2004/0012039 A1 | * | 1/2004 | Shirota | G11C 16/0433 257/200 |
| 2006/0018161 A1 | * | 1/2006 | Chen | H01L 27/115 365/185.28 |
| 2008/0061356 A1 | * | 3/2008 | Kim | H01L 21/28273 257/316 |
| 2009/0080257 A1 | * | 3/2009 | Oka | G11C 5/025 365/185.13 |
| 2011/0044112 A1 | * | 2/2011 | Torii | G11C 16/0433 365/185.18 |

FOREIGN PATENT DOCUMENTS

| | | |
|---|---|---|
| JP | 2004-031920 A | 1/2004 |
| JP | 2009-081181 A | 4/2009 |
| JP | 2009-194140 A | 8/2009 |
| JP | 2009-267185 A | 11/2009 |

* cited by examiner

FIG. 10

|  | EL | RG1 | RG2 | SL | Vpp | WL |
|---|---|---|---|---|---|---|
| PROGRAMMING (FROM SRAM TO NON-VOLATILE MEMORY UNIT) | 0 | Vdd | Vdd | 6 | Vdd | 0 |
| ERASURE (DATA ERASURE IN NON-VOLATILE MEMORY UNIT) | 7 | 0 | 0 | 0 | Vdd | 0 |
| DATA LOADING (FROM NON-VOLATILE MEMORY UNIT TO SRAM) | 0 | Vdd | Vdd | 3 | Vdd | 0 |
| WRITING (WRITING INTO SRAM) | Don't care | 0 | 0 | Don't care | Vdd | Vdd/0 |
| READING (READING FROM SRAM) | Don't care | 0 | 0 | Don't care | Vdd | Vdd/0 |
| Vth MONITOR LOADING | 0 | Vdd/0 | 0/Vdd | 0 or 3 | Vdd | Vdd |

NON-VOLATILE SEMICONDUCTOR STORAGE DEVICE

TECHNICAL FIELD

The present invention relates to a non-volatile semiconductor memory device, and is appropriately applied to a non-volatile semiconductor memory device in which charge is injected into a floating gate by source side injection (SSI) when a data is programmed, for example.

BACKGROUND ART

In recent years, active research on a non-volatile semiconductor memory device, which can be easily manufactured by a standard CMOS (Complementary Metal Oxide Semiconductor) process, has been conducted. Such a non-volatile semiconductor memory device can be roughly classified depending on a programming method during data programming. The major programming methods known include FN (Fowler Nordheim) tunneling injection, channel hot electron injection, and source side injection.

The source side injection among the programming methods is a system for obtaining a hot carrier in a source region of a channel and injecting the hot carrier into a floating gate, and includes one described in Patent Literature 1, for example. It has been known that data programming by such source side injection can be performed at a relatively low voltage and power consumption during programming can also be reduced. A benefit from combination use in LSI (Large Scale Integration) has been expected.

CITATION LIST

Patent Literature

Patent Literature 1: Japanese Patent Publication No. 7-60864

SUMMARY OF INVENTION

Technical Problem

However, as a non-volatile semiconductor memory device that programs data by source side injection, a two-layer polycrystalline silicon (polysilicon) structure in which polysilicons serving as a gate overlap each other has generally been used, as described in Patent Literature 1. A non-volatile semiconductor memory device that programs data by source side injection using a single-layer polysilicon structure, for example, has been still in a research stage.

Therefore, the present invention has been made in view of the foregoing points, and is directed to proposing a non-volatile semiconductor memory device capable of injecting charge into a floating gate by source side injection even in a single-layer gate structure.

Solution to Problem

To solve such an issue, a non-volatile semiconductor memory device according to the present invention includes a memory cell including a memory transistor having a single-layer gate structure having a floating gate and a switch transistor having a single-layer gate structure having a switch gate electrode, in which the memory cell has a configuration in which a source line is connected to one end of the memory transistor while a bit line is connected to one end of the switch transistor, the other end of the memory transistor and the other end of the switch transistor are electrically connected to each other, and the memory transistor and the switch transistor are arranged in series, and the memory transistor includes a high-resistance region having a higher resistance value between a region below the floating gate and a source-drain region at the other end electrically connected to the switch transistor than a resistance value between the region below the floating gate and a source-drain region at the one end.

Advantageous Effects of Invention

According to the present invention, while each of the memory transistor and the switch transistor is made to have a single-layer gate structure, when a memory cell is turned on by applying a high voltage to one end of a memory transistor from a source line during data programming and applying a low voltage to one end of a switch transistor from a bit line, a voltage drop occurs in a high-resistance region of the memory transistor between the source line and the bit line to generate an intense electric field, and charge can be injected into a floating gate by source side injection using the intense electric field.

BRIEF DESCRIPTION OF DRAWINGS

FIG. 10 is a table illustrating respective voltage values in each of sites during data programming, data erasure, data loading, data writing, data reading, and Vth monitor loading in the memory cell illustrated in FIG. 9.

DESCRIPTION OF EMBODIMENTS

Embodiments of the present invention will be described in detail below with reference to the drawings.

(1) Circuit Configuration of Non-Volatile Semiconductor Memory Device

Figure 1:
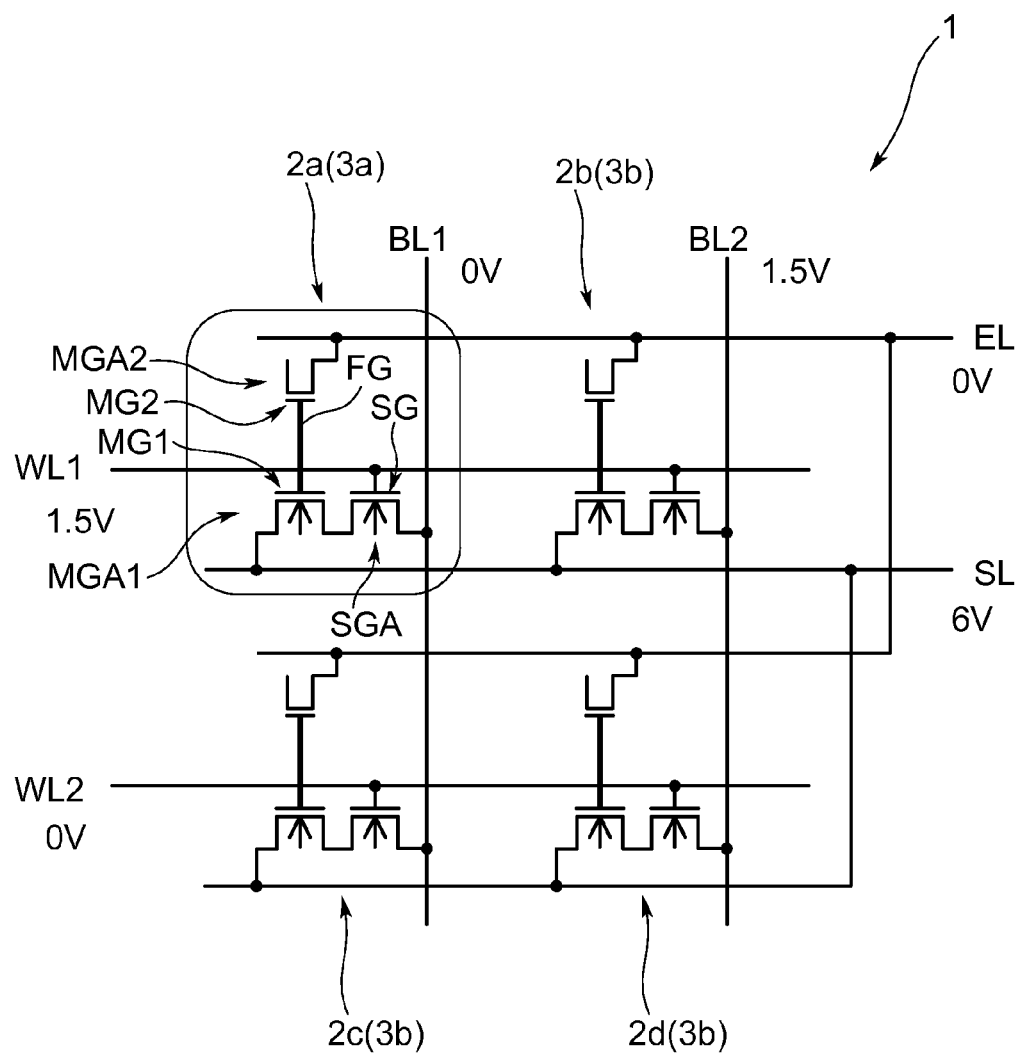
FIG. 1 is a circuit diagram illustrating a circuit configuration of a non-volatile semiconductor memory device according to the present invention.

In FIG. 1, reference numeral 1 denotes a non-volatile semiconductor memory device including four memory cells 2a, 2b, 2c, and 2d arranged in two rows and in two columns, for example, so that data can be programmed to the memory cell 2a optionally selected, for example, among the memory cells 2a, 2b, 2c, and 2d by source side injection. In this case, the non-volatile semiconductor memory device 1 includes two bit lines BL1 and BL2 while including two word lines WL1 and WL2, and the memory cells 2a, 2b, 2c, and 2d are respectively arranged at positions where the bit lines BL1 and BL2 and the word lines WL1 and WL2 cross each other.

The non-volatile semiconductor memory device 1 is configured so that an erase line EL is connected to the memory cells 2a, 2b, 2c, and 2d and a predetermined voltage can be uniformly applied to the memory cells 2a, 2b, 2c, and 2d via the erase line EL. Further, the non-volatile semiconductor memory device 1 is configured so that a source line SL is connected to the memory cells 2a, 2b, 2c, and 2d and a predetermined voltage can be uniformly applied to the memory cells 2a, 2b, 2c, and 2d via the source line SL.

In the present embodiment, all the memory cells 2a, 2b, 2c, and 2d have the same configuration, and hence the one memory cell 2a is paid attention to in order to avoid overlapping of description. The memory cell 2a includes an N-type MOS memory MOS transistor (hereinafter referred to as a memory transistor) MGA1, a P-type MOS erase MOS transistor (hereinafter referred to as an erase transistor) MGA2, and an N-type MOS switch MOS transistor (hereinafter referred to as a switch transistor) SGA, and the memory transistor MGA1 and the erase transistor MGA2 share one floating gate FG.

The floating gate FG extends to respective active regions (described below) of the memory transistor MGA1 and the erase transistor MGA2, and can be a gate electrode MG1 of the memory transistor MGA1 and an erase gate electrode MG2 of the erase transistor MGA2. In the memory cell 2a, the source line SL also connected to the other memory cell 2b, 2c, and 2d is connected to one end of the memory transistor MGA1 while the erase line EL also connected to the other memory cells 2b, 2c, and 2d is connected to one end of the erase transistor MGA2.

The switch transistor SGA has its one end connected to the bit line BL1 also connected to the other memory cell 2c arranged in one direction and has its switch gate electrode SG connected to the word line WL1 also connected to the other memory cell 2b arranged in the other direction, and can be turned on or off due to a voltage difference between the bit line BL1 and the word line WL1. The switch transistor SGA has its other end electrically connected to the other end of the memory transistor MGA1, and is arranged in series with the memory transistor MGA1.

The other end of the erase transistor MGA2 is short-circuited to a second active region, described below. In FIG. 1, the area of the gate electrode MG1 of the memory transistor MGA1 is made larger than the area of the erase gate electrode MG2 of the erase transistor MGA2, and a potential from the memory transistor MGA1 is easily transmitted to the floating gate FG by an increased area of the gate electrode MG1 of the memory transistor MGA1. When data is programmed, a large-capacity current is generated in the memory transistor MGA1 so that a lot of charge can be injected into the floating gate FG from the active region.

Figure 2:
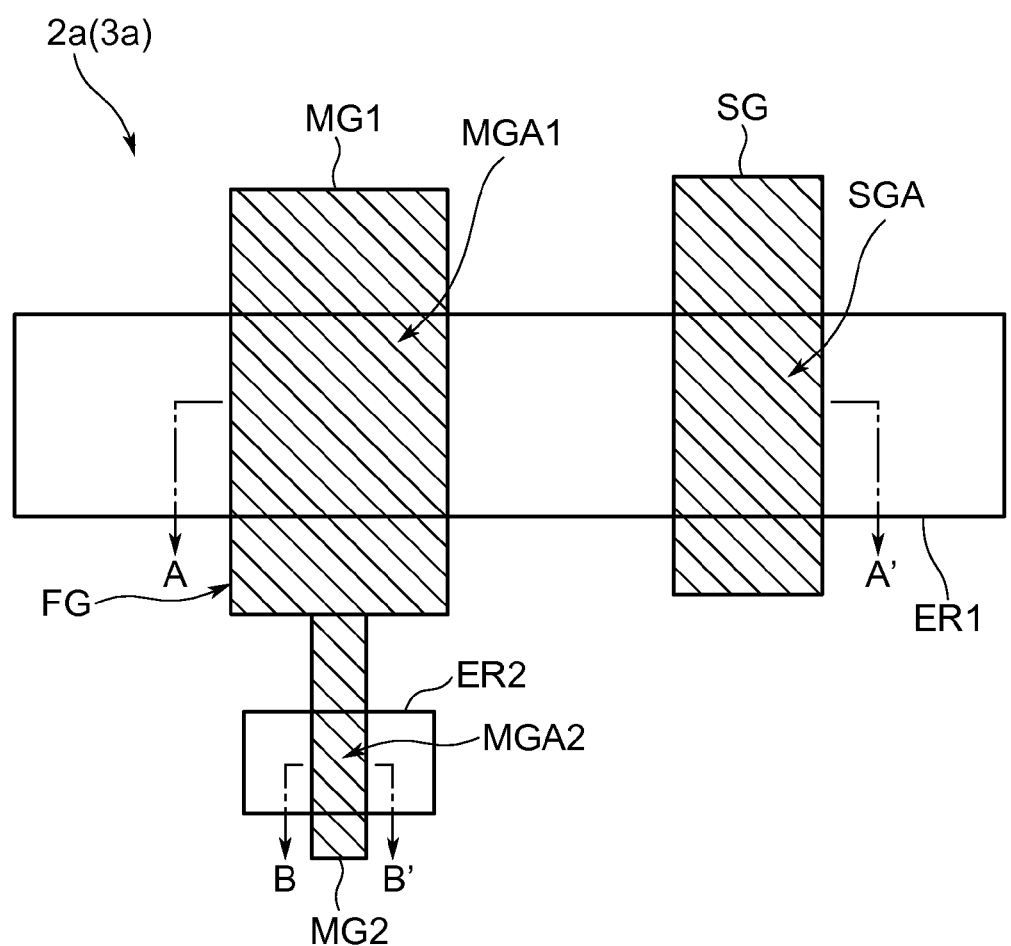
FIG. 2 is a schematic view illustrating a layout of a circuit configuration of a memory cell illustrated in FIG. 1.

FIG. 2 is a schematic view illustrating an example of a layout for implementing a circuit configuration of the memory cell 2a illustrated in FIG. 1. In this case, a P-type first active region ER1, for example, is formed in the memory cell 2a. The gate electrode MG1 of the memory transistor MGA1 constituting the floating gate FG and the switch gate electrode SG of the switch transistor SGA are arranged in a first active region ER1, and the memory transistor MGA1 and the switch transistor SGA are arranged in series. An N-type second active region ER2, for example, is formed in the memory cell 2a. The erase gate electrode MG2 of the erase transistor MGA2 connected to the gate electrode MG1 of the memory transistor MGA1 is arranged in the second active region ER2.

Figure 3:
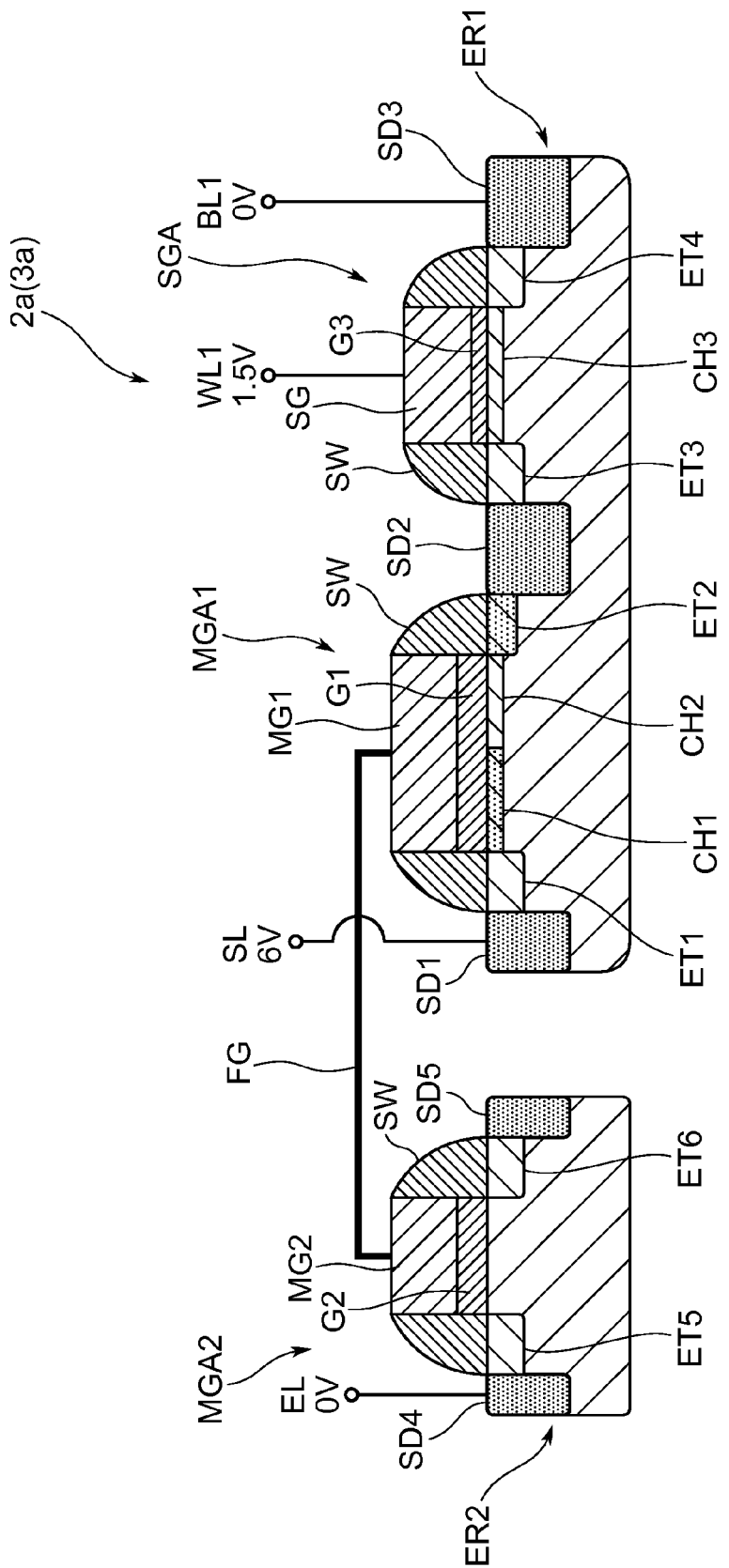
FIG. 3 is a sectional side elevation illustrating a cross-section structure of a portion taken along a line A-A' and a cross-section structure of a portion taken along a line B-B' illustrated in FIG. 2.

FIG. 3 is a cross-sectional view illustrating side cross-section structures of a portion taken along a line A-A' (the right side in FIG. 3) and a portion taken along a line B-B' (the left side in FIG. 3) illustrated in FIG. 2. The switch transistor SGA has a configuration in which source-drain regions SD2 and SD3 are formed apart from each other in the first active region ER1, and the bit line BL1 is connected to the source-drain region SD3 at its one end. Extension regions ET3 and ET4 are respectively formed to contact side surfaces of the source-drain regions SD2 and SD3 on an upper surface of the first active region ER1 between the source-drain regions SD2 and SD3, and a channel region CH3 is formed between the extension regions ET3 and ET4. The switch transistor SGA has a switch gate electrode SG via a gate oxide film G3 on the channel region between the extension regions ET3 and ET4, and has a configuration in which a word line WL1 is connected to the switch gate electrode SG. A sidewall SW covering a side surface of the switch gate electrode SG is formed on an upper surface of each of the extension regions ET3 and ET4.

On the other hand, the memory transistor MGA1 shares the source-drain region SD2 with the switch transistor SGA, and is arranged in series with the adjacent switch transistor SGA. The memory transistor MGA1 has a source-drain region SD1 formed in the first active region ER1 a predetermined distance apart from the source-drain region SD2, and has a configuration in which the source line SL is connected to the source-drain region SD1 at its one end. A programming voltage or the like can be applied to the source-drain region SD1 via the source line SL.

In addition thereto, in the memory transistor MGA1, an extension region ET1 contacting a side surface of the source-drain region SD1 at the one end and an extension region (hereinafter referred to as a low-concentration impurity extension region) ET2 contacting the side surface of the source-drain region SD2 at the other end are formed on the upper surface of the first active region ER1. In the memory transistor MGA1, a gate electrode MG1 serving as the floating gate FG is formed via a gate oxide film G1 on the upper surface of the first active region ER1 between the extension region ET1 and the low-concentration impurity extension region ET2, and a sidewall SW covering both side surfaces of the gate electrode MG1 is formed on each of the upper surfaces of the extension region ET1 and the low-concentration impurity extension region ET2.

The present invention has a characteristic in that in the memory transistor MGA1, the impurity concentration of the low-concentration impurity extension region ET2 formed in a region below the sidewall on the side of the switch transistor SGA (a region between a region below the floating gate FG and the source-drain region SD2 at the other end) is selected as a lower concentration than that of the extension region ET1 between a region below the floating gate FG and the source-drain region SD1 at the one end, and the low-concentration impurity extension region ET2 has a higher resistance value than the resistance value of the extension region ET1 on the side of the source line SL. In the present embodiment, the low-concentration impurity extension region ET2 serving as a high-resistance region preferably has an impurity doping amount of 1 E18/cm$^3$ or less.

In the memory transistor MGA1 having such a configuration, the largest potential drop can occur in the low-concentration impurity extension region ET2 having an increased resistance value when a large potential difference occurs between the source line SL and the bit line BL1 during data programming, described below.

In addition thereto, the present embodiment also has a characteristic in that a deplete-type channel region CH1 contacting a side surface of the extension region ET1 and an enhancement-type channel region CH2 having both its ends contacting the deplete-type channel region CH1 and the low-concentration impurity extension region ET2 are formed on the upper surface of the first active region ER1 between the extension region ET1 and the low-concentration impurity extension region ET2. The deplete-type channel region CH1 is in a deplete state after impurities such as arsenic and phosphorus are doped thereinto. On the other hand, the channel region CH2 adjacent to the deplete-type channel region CH1 is in an enhancement state after impurities such as boron are doped thereinto. In the memory transistor MGA1 having such a configuration, respective voltages of the deplete-type channel region CH1 and the gate electrode MG1 synergistically rise when a programming voltage is applied to the source-drain region SD1 from the source line SL during data programming, described below, and a value of a voltage applied to a terminal end of the low-concentration impurity extension region ET2 can finally be raised to a value of a voltage applied to the source line SL (details thereof will be described below).

The erase transistor MGA2 has a configuration in which source-drain regions SD4 and SD5 are formed apart from each other in the second active region ER2 formed separately from the first active region ER1, and the erase line EL is connected at least to a source-drain region SD4 at its one end as illustrated in FIG. 3. An extension region ET5 is formed to contact a side surface of the source-drain region SD4 while an extension region ET6 is formed to also contact a side surface of the source-drain region SD5 at the other end on the upper surface of the second active region ER2 between the source-drain regions SD4 and SD5. In the erase transistor MGA2, the erase gate electrode MG2 serving as the floating gate FG is formed via a gate oxide film G2 on a channel region between the extension regions ET5 and ET6, and is connected to the gate electrode MG1 of the memory transistor MGA1. A sidewall SW is formed to cover both side surfaces of the erase gate electrode MG2 on respective upper surfaces of the extension regions ET5 and ET6.

(2) Data Programming Operation

In the non-volatile semiconductor memory device 1 according to the present invention, a data programming operation will be described below. FIG. 1 illustrates respective voltage values in sites when data is programmed to only the memory cell 2a in the first row and the first column among the plurality of memory cells 2a, 2b, 2c, and 2d. The memory cell 2a to which data is programmed is referred to as a selected memory cell 3a, and the memory cells 2b, 2c, and 2d to which no data is programmed are referred to as a non-selected memory cell 3b.

In this case, in the non-volatile semiconductor memory device 1, a low voltage of 0 [V] can be applied to the erase line EL while a programming voltage of 6 [V] serving as a high voltage can be applied to the source line SL during data programming as illustrated in FIG. 1. Thus, in the non-volatile semiconductor memory device 1, a voltage of 0 [V] can be uniformly applied from the erase line EL to the erase transistors MGA2 in the memory cells 2a, 2b, 2c, and 2d while a programming voltage of 6 [V] can be uniformly applied from the source line SL to the memory transistors MGA1 in the memory cells 2a, 2b, 2c, and 2d.

On the other hand, the switch transistor SGA in the selected memory cell 3a can be turned on when 1.5 [V] is applied to the switch gate electrode SG from the word line WL1 while a programming voltage of 0 [V] is applied to its one end from the bit line BL1. As illustrated in FIG. 3, when the switch transistor SGA is turned on, a potential in the source-drain region SD2, which the switch transistor SGA shares with the memory transistor MGA1, reaches the same 0 [V] as that on the bit line BL1. In this case, in the memory transistor MGA1 arranged in series with the switch transistor SGA, a programming voltage of 6 [V] is applied to the source-drain region SD1 at the one end from the source line SL, and a channel potential rises so that a potential in the channel region CH2 can rise to the programming voltage.

In practice, in the present embodiment, in the memory transistor MGA1, the deplete-type channel region CH1 is formed to contact the side surface of the extension region ET1. Thus, a channel voltage can rise to a threshold voltage Vth (Vth<0) in the deplete state in the deplete-type channel region CH1 during data programming. If the gate electrode MG1 serving as the floating gate FG has no charge, and the concentration of the deplete-type channel region CH1 is −2 [V] with the threshold voltage Vth, for example, when 6 [V] is applied to the source line SL, a potential in the deplete-type channel region CH1 first can rise to 2 [V] during data programming. At that time, a potential of the gate electrode MG1 rises in proportion to the potential in the deplete-type channel region CH1 by capacitive coupling.

If a capacitance ratio of the capacitance of the gate electrode MG1 to the entire capacitance (a capacitance ratio between the gate electrode MG1 and the deplete-type channel region CH1) is 0.5, for example, the potential of the gate electrode MG1 rises from 0 [V] to 1 [V] when the potential in the deplete-type channel region CH1 rises to a voltage of 2 [V]. In this case, the larger the capacitance ratio is, the higher the efficiency of a voltage rise of the gate electrode MG1 becomes. Thus, the area of the gate electrode MG1 of the memory transistor MGA1 is desirably made larger than that of the erase gate electrode MG2 of the erase transistor MGA2.

In the memory transistor MGA1, when the potential of the gate electrode MG1 then rises to 1 [V], an allowable potential, which can be applied to the deplete-type channel region CH1, also rises, and the potential in the deplete-type channel region CH1 further rises by 1 [V] to 3 [V]. Thus, the potential of the gate electrode MG1 in the memory transistor MGA1 changes in proportion to the potential in the deplete-type channel region CH1 by capacitive coupling, and rises from 1 [V] to 1.5 [V] when the potential in the deplete-type channel region CH1 becomes a voltage of 3 [V].

In the memory transistor MGA1, the potential in the deplete-type channel region CH1 rises synergistically with the potential of the gate electrode MG1. A potential in the channel region CH2 also contributes to capacitive coupling if the channel region CH2 is turned on, the potential of the gate electrode MG1 further rises. Finally, the potential in the channel region CH2 can reach a value close to 6 [V] applied to the source line SL.

Thus, a potential in the low-concentration impurity extension region ET2 becomes a programming voltage of 6 [V] at its end contacting the channel region CH2 while becoming 0 [V] at its end contacting the source-drain region SD2 so that a high voltage difference of 6 [V] occurs between both the ends, to generate an intense electric field. Thus, in the memory transistor MGA1, charge in the low-concentration impurity extension region ET2 is accelerated using the intense electric field generated in the low-concentration impurity extension region ET2, and a part of a secondary charge generated from the charge can be injected into the gate electrode MG1 serving as the floating gate FG. As a result, the selected memory cell 3a can enter a state where the charge is stored in the floating gate FG so that data is programmed.

While the selected memory cell 3a is made to have a single-layer gate structure in which each of the gate electrode MG1 of the memory transistor MGA1, the erase gate electrode MG2 of the erase transistor MGA2, and the switch gate electrode SG of the switch transistor SGA is formed of a single layer, when the intense electric field is generated in the low-concentration impurity extension region ET2 during data programming, the charge can be injected into the floating gate FG using the intense electric field, and the data programming can be implemented by source side injection in the single-layer gate structure.

The low-concentration impurity extension region ET2 has a high resistance value while the impurity concentration thereof is made low. In the low-concentration impurity extension region ET2, a large voltage drop occurs during data programming. However, a potential in the adjacent source-drain region SD2 can be suppressed to a voltage close to 0 [V], and a high programming voltage can be prevented from being applied to the switch transistor SGA. Thus, in the switch transistor SGA, the thickness of the gate oxide film G3 need not be as large as the film thickness (approximately 7 [nm]) of the gate oxide film G1 in the memory transistor MGA1, and can be as small as 3 to 4 [nm], for example. A core MOS having a thin gate oxide film generally used in a non-volatile memory can be used as it is.

At this time, as illustrated in FIG. 1, in the non-volatile semiconductor memory device 1, a programming inhibition voltage of 1.5 [V] is applied to the bit line BL2 to which only the non-selected memory cell 3b is connected while a voltage of 0 [V] is applied to the word line WL2 to which only the non-selected memory cell 3b is connected. Thus, in the non-selected memory cell 3b (the memory cells 2b and 2d) connected to the bit line BL2, when 1.5 [V] and 0 [V] are respectively applied from the word lines WL1 and WL2 to the switch gate electrodes SG of the switch transistors SGA, and 1.5 [V] is applied to respective one ends of the switch transistors SGA from the bit line BL2, the switch transistors SGA are turned off. Thus, charge is not accelerated in the low-concentration impurity extension region ET2 in the memory transistor MGA1 and cannot be injected into the floating gate FG.

In the non-selected memory cell 3b (the memory cell 2c) connected to the bit line BL1 to which a programming voltage of 0 [V] is applied, when 0 [V] is applied from the word line WL2 to the switch gate electrode SG of the switch transistor SGA, the switch transistor SGA is turned off. Thus, charge is not accelerated in the low-concentration impurity extension region ET2 in the memory transistor MGA1 and cannot be injected into the floating gate FG.

Thus, in the non-volatile semiconductor memory device 1, when the switch transistor SGA in the non-selected memory cell 3b is turned off, no charge is injected into the floating gate FG in the non-selected memory cell 3b. Thus, charge is injected into only the floating gate FG in the desired selected memory cell 3a by source side injection so that data can be programmed.

While in the above-mentioned embodiment, a case where not only the deplete-type channel region CH1 but also the enhancement-type channel region CH2 is formed in the channel layer of the memory transistor MGA1 has been described, the present invention is not limited to this.

For example, the entire channel layer of the memory transistor MGA1 may be formed of the deplete-type channel region CH1. However, when the deplete-type channel region CH1 is formed in the entire channel layer, the gate length of the gate electrode MG1 needs to be increased in consideration of a short channel effect.

Even when the entire channel is of a deplete type, the channel concentration on the side close to the extension region ET1 and the channel concentration on the side close to the low-concentration impurity extension region ET2 may be changed.

When the deplete-type channel region CH1 and the enhancement-type channel region CH2 are formed, the deplete-type channel region CH1 is preferably selected to be longer in a channel length direction than the channel region CH2, and a ratio of the deplete-type channel region CH1 to the channel region CH2 is desirably X:1 (X>1) in the entire gate length, for example. If the deplete-type channel region CH1 is thus selected to be longer in the channel length direction than the channel region CH2, a floating potential during a programming operation more rises. Thus, the drop of a source potential in the channel region is reduced. Therefore, the efficiency of injection can be more enhanced by more enhancing an electric field generated in the low-concentration impurity extension region ET2.

(3) Data Reading Operation

Figure 4:
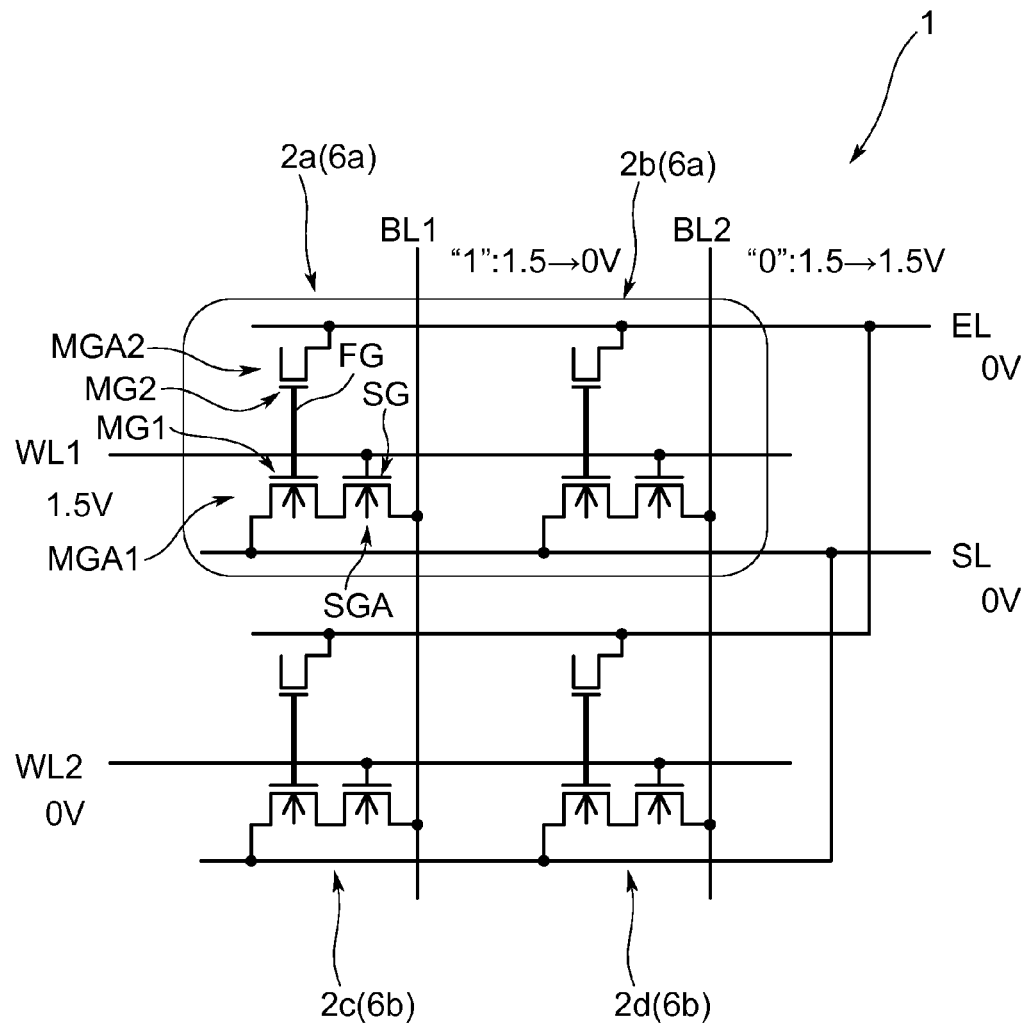
FIG. 4 is a circuit diagram illustrating respective voltage values in sites during data reading.

In the non-volatile semiconductor memory device 1, application of a voltage in reading out data will be described below. FIG. 4 where portions corresponding to those illustrated in FIG. 1 are assigned the same reference numerals illustrates respective voltage values in sites when data in the memory cells 2a and 2b in the first row among the memory cells 2a, 2b, 2c, and 2d are read out. The memory cells 2a and 2b from which data is read out are referred to as a reading memory cell 6a, and the memory cells 2c and 2d from which no data is read out are referred to as a non-reading memory cell 6b. In this case, data is programmed to only the memory cell 2b among the memory cells 2a, 2b, 2c, and 2d, and no data is programmed to the other memory cells 2a, 2c, and 2d. Further, a state where charge is stored in the floating gate FG (when data is programmed) is "0", for example, and a state where no charge is stored in the floating gate FG (when no data is programmed) is "1".

In this case, the non-volatile semiconductor memory device 1 can determine the presence or absence of data programming, by applying a reading voltage of 1.5 [V], for example, to the bit lines BL1 and BL2 connected to the reading memory cell 6a to precharge the bit lines BL1 and BL2 while applying 1.5 [V] to the word line WL1 connected to the reading memory cell 6a to turn on the switch transistor SGA, based on changes in reading voltages of the bit lines BL1 and BL2.

For example, in the reading memory cell 6a (the memory cell 2b) in which charge is stored in the floating gate FG (data is programmed), the memory transistor MGA1 is turned off, and a reading voltage on the bit line BL2 remains 1.5 [V]. On the other hand, in the other reading memory cell 6a (the memory cell 2a) in which no charge is stored in the floating gate FG (no data is programmed), the memory transistor MGA1 is turned on. Thus, a reading voltage on the bit line BL1 changes to be a lower voltage value (e.g., 0 [V]) than 1.5 [V]. The non-volatile semiconductor memory device 1 can define reading information by detecting changes in reading voltages of the bit lines BL1 and BL2 and bringing the bit line BL2 on which the reading voltage does not change from 1.5 [V] into "0" and bringing the other bit line BL1 on which the reading voltage has changed into "1".

(4) Data Erasure Operation

In the non-volatile semiconductor memory device 1, application of a voltage in erasing data in the memory cells 2a, 2b, 2c, and 2d will be described below. An operation for erasing data in the non-volatile semiconductor memory device 1 may include various erasure methods such as an erasure method using hole injection due to a tunneling current between bands, an erasure method using an edge of the gate electrode MG1 of the memory transistor MGA1 serving as the floating gate FG and edge tunneling emission between the source-drain regions SD1 and SD2 (FIG. 3), and an erasure method using FN tunneling emission using an entire surface of the channel layer if a technique for emitting electrons from the floating gate FG or injecting holes into the floating gate FG is used.

Figure 5:
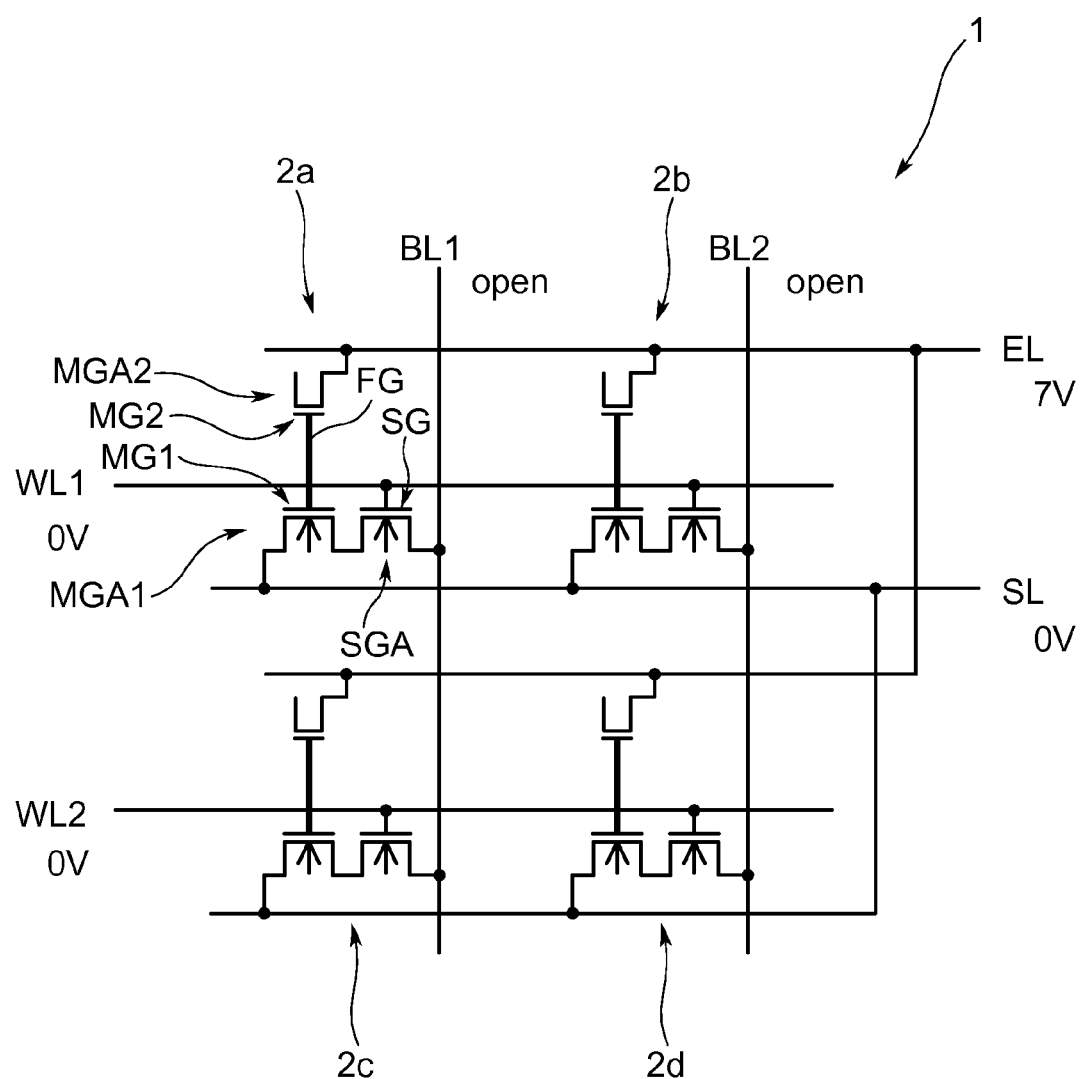
FIG. 5 is a circuit diagram illustrating respective voltage values in sites during data erasure.

FIG. 5 where portions corresponding to those illustrated in FIG. 1 are assigned the same reference numerals illustrate respective voltage values in sites for a case where the erasure method using hole injection due to a tunneling current between bands among the erasure methods is used. In this case, the erase transistor MGA2 is used, to apply a positive erasure voltage of 7 [V] to the erase line EL, apply a low voltage of 0 [V] to the source line SL, and further make the bit lines BL1 and BL2 open.

Thus, in the non-volatile semiconductor memory device 1, the data in the memory cells 2a, 2b, 2c, and 2d can be erased in mat collective processing by applying an erasure voltage in a mat collective manner to the respective erase transistors MGA2 in the memory cells 2a, 2b, 2c, and 2d via the erase line EL, and injecting a hole into the floating gate FG from the channel layer of the erase transistor MGA2 in the memory cell 2b in which charge is stored in the floating gate, for example.

While the gate electrode MG1 of the memory transistor MGA1 and the erase gate electrode MG2 of the erase transistor MGA2 are generally formed of polysilicon in the present embodiment, the present invention is not limited to this. For example, impurities such as phosphorus may be doped into the gate electrode MG1 of the memory transistor MGA1, to form an N-type gate electrode MG1 while impurities such as boron may be doped into the erase gate electrode MG2 of the erase transistor MGA2, which causes tunneling between bands, to form a P-type erase gate electrode MG2.

In this case, there is a difference in a work function between the N-type gate electrode MG1 and the P-type erase gate electrode MG2 is 1 [V] or more. Thus, in the floating gate FG, a potential drop of approximately 1 [V] can occur between the N-type gate electrode MG1 and the P-type erase gate electrode MG2. The efficiency of the generation of the tunneling current between bands is more improved in the erase transistor MGA2 and a hole can be more easily injected into the floating gate FG than when only the N-type gate electrode constitutes the floating gate.

(5) Operation and Effect

In the foregoing configuration, the memory cell 2a includes the memory transistor MGA1 having a single-layer gate structure having the floating gate FG and the switch transistor SGA having a single-layer gate structure having the switch gate electrode SG, in which the source line SL is connected to one end of the memory transistor MGA1, the bit line BL1 is connected to one end of the switch transistor SGA, the source-drain region SD2 is shared between the other end of the memory transistor MGA1 and the other end of the switch transistor, and the memory transistor MGA1 and the switch transistor SGA are arranged in series. In the memory transistor MGA1, the extension region ET1 is formed on the side surface of the source-drain region SD1 at the one end, and the low-concentration impurity extension region ET2 is formed on the side surface of the source-drain region SD2 at the other end electrically connected to the switch transistor SGA, to make the impurity concentration of the low-concentration impurity extension region ET2 lower than that of the extension region ET1 and make the resistance value of the low-concentration impurity extension region ET2 higher.

When the selected memory cell 3a is turned on by applying a programming voltage of 6 [V] to the one end of the memory transistor MGA1 from the source line SL and applying a voltage of 0 [V] to the one end of the switch transistor SGA from the bit line BL1 during data programming, therefore, a voltage drop of 6 [V] occurs to generate the intense electric field in the low-concentration impurity extension region ET2 at the side adjacent to the switch transistor SGA in the memory transistor MGA1. Data can be programmed by so-called source side injection for injecting charge into the floating gate FG using this intense electric field.

Particularly in the present embodiment, in the memory transistor MGA1, the deplete-type channel region CH1 is formed between the extension region ET1 and the low-concentration impurity extension region ET2. When a programming voltage of 6 [V] is applied to the one end of the memory transistor MGA1 during data programming, the voltage of the gate electrode MG1 serving as the floating gate FG and the voltage of the deplete-type channel region CH1 synergistically rise. Finally, the same voltage of 6 [V] as the programming voltage applied to the source line SL can be applied to the low-concentration impurity extension region ET2 at the other end of the memory transistor MGA1, and a high voltage drop required for source side injection can occur in the low-concentration impurity extension region ET2.

Thus, in the memory cell 2a, a high voltage drop occurs in only the low-concentration impurity extension region ET2 so that the switch transistor SGA adjacent to the memory transistor MGA1 can be suppressed to a low voltage. Thus, the film thickness of the gate oxide film G3 in the switch transistor SGA can be made as small as approximately 3 to 4 [nm], and a configuration of a general core MOS having a thin gate oxide film can be used as it is.

In the non-volatile semiconductor memory device 1, a voltage applied to each of the bit lines BL1 and BL2 and the word lines WL1 and WL2 can be suppressed to a voltage of 1.5 [V] or less during data programming. Thus, a matrix selection circuit (not illustrated) that controls the bit lines BL1 and BL2 and the word lines WL1 and WL2 can be designed in the core MOS (1.5 V-MOS) that premises a low voltage, and a faster operation can be performed and a circuit area can be reduced because the gate oxide film G3 in the switch transistor SGA can be thinned.

According to the above-mentioned configuration, while each of the memory transistor MGA1 and the switch transistor SGA is made to have a single-layer gate structure, when the memory cell 2a is turned on by applying a high voltage to one end of the memory transistor MGA1 from the source line SL and applying a low voltage to one end of the switch transistor SGA from the bit line BL1 during data programming, a voltage drop occurs to generate an intense electric field in the low-concentration impurity extension region ET2 in the memory transistor MGA1 between the source line SL and the bit line BL1, and charge can be injected into the floating gate FG by source side injection using the intense electric field.

(6) Another Embodiment

While a case where the deplete-type channel region CH1 is formed in the channel layer of the memory transistor MGA1, and the voltage of the channel layer is gradually raised by a synergetic effect between the floating gate FG and the deplete-type channel region CH1 has been described in the above-mentioned embodiment, the present invention is not limited to this. As in FIG. 6 where portions corresponding to those illustrated in FIG. 1 are assigned the same reference numerals, a coupling capacitor MGA3 to which a floating gate FG extends is provided, and a potential in the coupling capacitor MGA3 is made high to raise a potential at the floating gate FG so that a channel layer of a memory transistor MGA1 may be turned on. In this case, even if a deplete-type channel region CH1 as illustrated in FIG. 3 is not formed and only a mere enhancement-type channel region CH4 (described below in FIG. 8) is formed on the channel layer of the memory transistor MGA1, a channel region CH4 in the memory transistor MGA1 can be turned on due to a high potential from the coupling capacitor MGA3.

Figure 6:
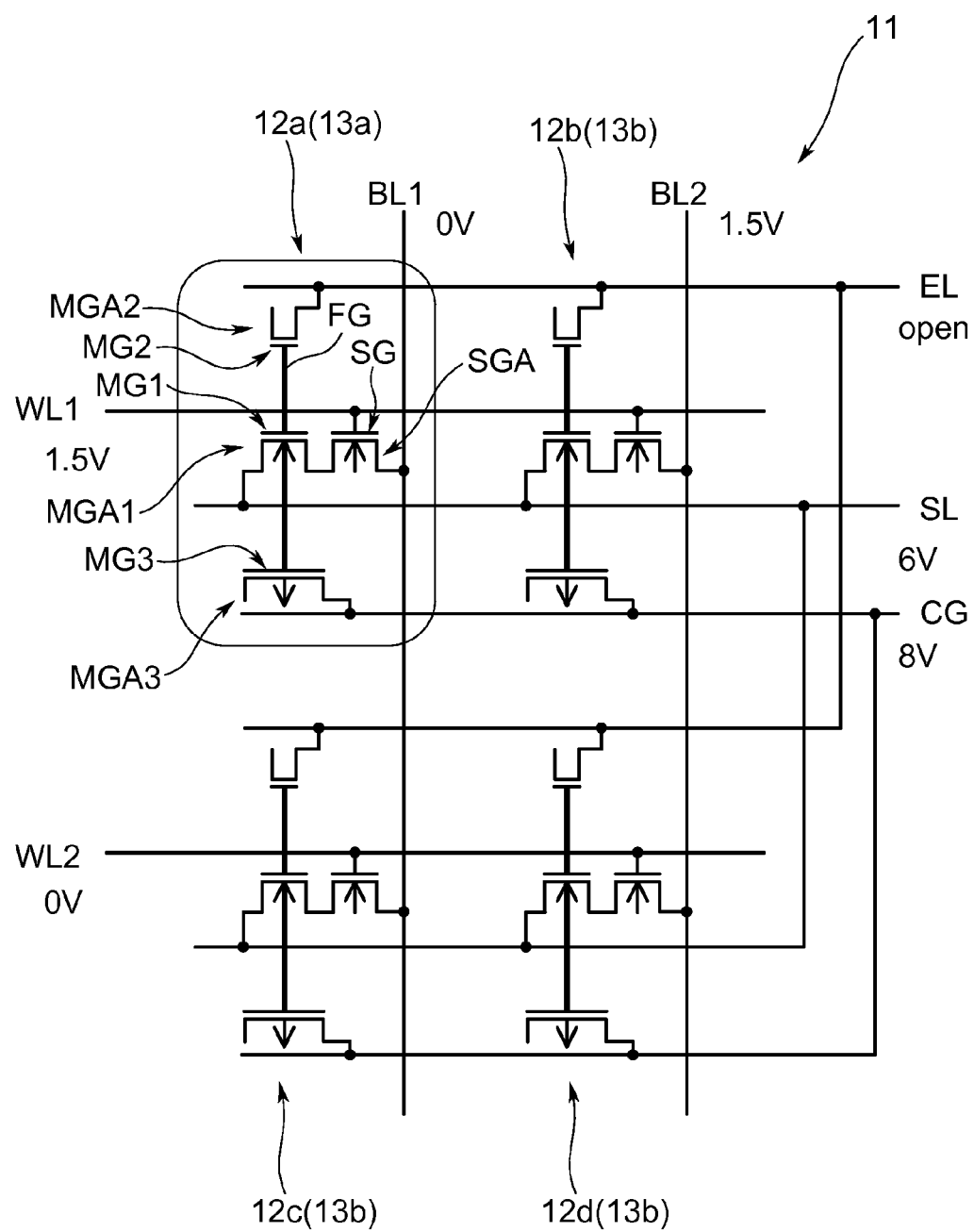
FIG. 6 is a circuit diagram illustrating a circuit configuration of a non-volatile semiconductor memory device according to another embodiment.
Figure 7:
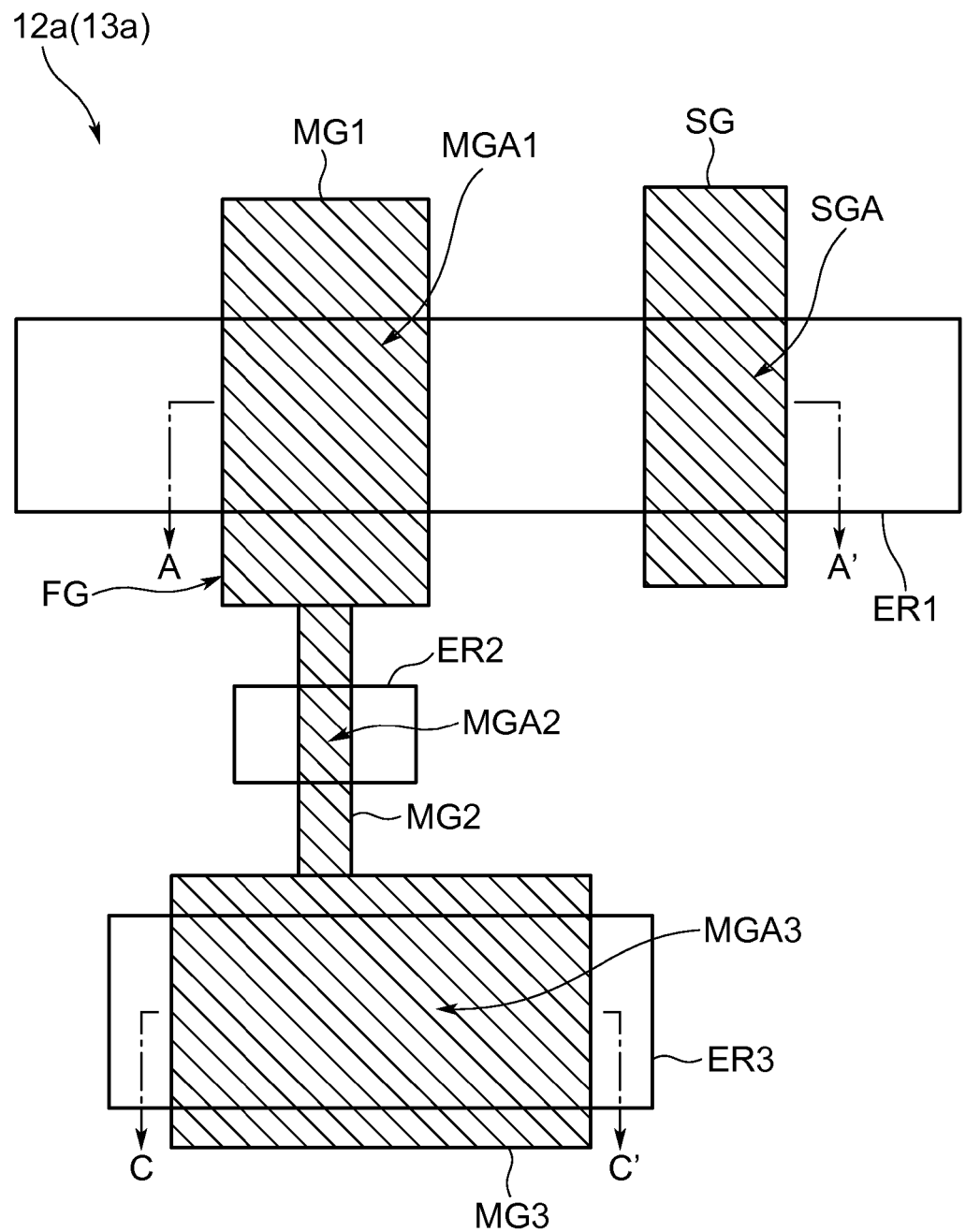
FIG. 7 is a schematic view illustrating a layout of a circuit configuration of a memory cell illustrated in FIG. 6.

In practice, as illustrated in FIG. 6, in a non-volatile semiconductor memory device 11 having such a configuration, a coupling gate line CG is connected to one end of each of coupling capacitors MGA3 in memory cells 12a, 12b, 12c, and 12d, and a predetermined voltage can be uniformly applied to the coupling capacitors MGA3 via the coupling gate line CG. FIG. 7 where portions corresponding to those illustrated in FIG. 2 are assigned the same reference numerals is a schematic view illustrating an example of a layout implementing a circuit configuration of the memory cell 12a illustrated in FIG. 6. In this case, an N-type third active region ER3 is formed in the memory cell 12a, and a coupling gate electrode MG3 of the coupling capacitor MGA3 is formed in a third active region ER3 while the coupling gate electrode MG3 is connected to an erase gate electrode MG2 of an erase transistor MGA2. The gate electrode MG1, the erase gate electrode MG2, and the coupling gate electrode MG3 form the floating gate FG.

Figure 8:
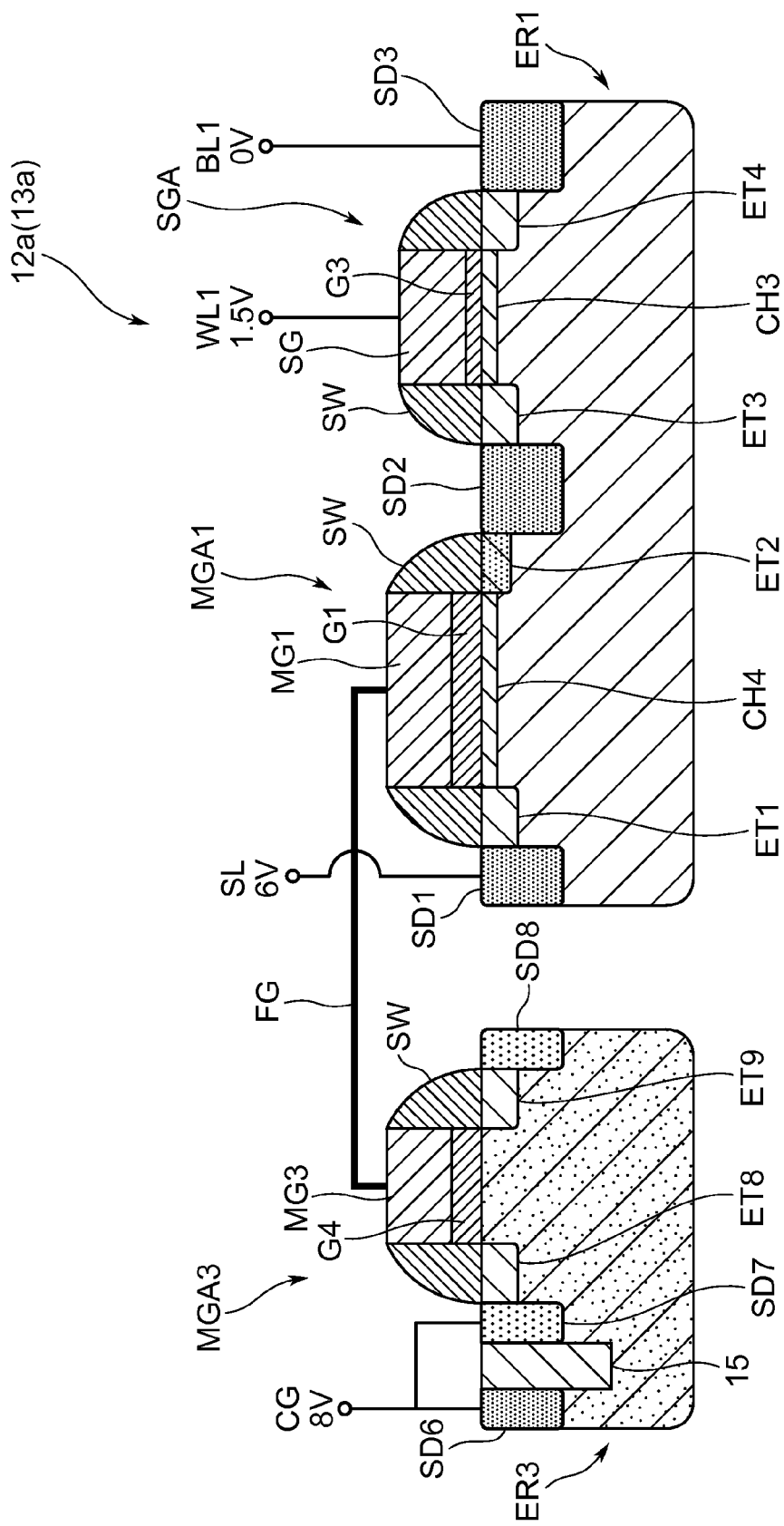
FIG. 8 is a sectional side elevation illustrating a cross-section structure of a portion taken along a line A-A' and a cross-section structure of a portion taken along a line C-C' illustrated in FIG. 7.

FIG. 8 where portions corresponding to FIG. 3 are assigned the same reference numerals is a cross-sectional view illustrating a side cross-section configuration of a portion taken along a line A-A' (the right side in FIG. 8) and a portion taken along a line C-C' (the left side in FIG. 8) illustrated in FIG. 7. In FIG. 8, sites illustrated in FIG. 7 are not written to respectively match the areas of the sites (e.g., the coupling gate electrode MG3 is written smaller than a gate electrode MG1 in FIG. 8, although larger than the gate electrode MG1), and a side cross-section configuration of each of the sites is schematically illustrated.

As illustrated in FIG. 8, in this case, in the memory transistor MGA1, a deplete-type channel region CH1 (FIG. 3) is not formed between an extension region ET1 and a low-concentration impurity extension region ET2, and the entire channel layer is formed of only the enhancement-type channel region CH4, unlike in the above-mentioned embodiment. In the coupling capacitor MGA3, P-type source-drain regions SD7 and SD8 are formed apart from each other in the N-type third active region ER3, for example, and the coupling gate line CG is connected to the source-drain region SD7 at its one end. This coupling gate line CG is also connected to a source-drain region SD6 in adjacent another coupling capacitor (not illustrated) formed via a device isolation layer 15. The source-drain region SD6 is of an N-type, and is a power feeding region to a well.

In the coupling capacitor MGA3, an extension region ET8 contacting a side surface of the source-drain region SD7 at the one end and an extension region ET9 contacting a side surface of the source-drain region SD8 at the other end are formed on an upper surface of the third active region ER3 between the source-drain regions SD7 and SD8. In the coupling capacitor MGA3, a coupling gate electrode MG3 serving as a floating gate FG is formed via a gate oxide film G4 on a channel layer between the P-type extension regions ET8 and ET9, and a sidewall SW is formed to cover both side surfaces of the coupling gate electrode MG3 on upper surfaces of the extension regions ET8 and ET9.

A data programming operation in the non-volatile semiconductor memory device 11 will be described below. FIG. 6 illustrates respective voltage values in sites when data is programmed to only the memory cell 12a in the first row and the first column among the plurality of memory cells 12a, 12b, 12c, and 12d. In practice, in the non-volatile semiconductor memory device 11, during data programming, a programming voltage of 8 [V] is uniformly applied to respective coupling capacitors MGA3 in the memory cells 12a, 12b, 12c, and 12d via the coupling gate line CG, to make an erase line EL open.

Thus, in a selected memory cell 13a into which data is programmed when the programming voltage of 8 [V] is applied to the coupling gate line CG, as illustrated in FIG. 8, a potential at the floating gate FG rises by a capacitance ratio by capacitive coupling occurring between the coupling capacitor MGA3 and the floating gate FG. Thus, the memory transistor MGA1 to which a source line SL is connected is turned on, to transmit a potential on the source line SL to the channel region CH4 in the memory transistor MGA1. As a result, in the memory transistor MGA1 adjacent to a switch transistor SGA to which a voltage of 0 [V] is applied form a bit line BL1, an intense electric field required for source side injection occurs in the low-concentration impurity extension region ET2, and charge is injected into the floating gate FG using the intense electric field so that data can be programmed, like in the above-mentioned embodiment.

The area of the coupling gate electrode MG3 of the coupling capacitor MGA3 is made larger than that of the gate electrode MG1 of the memory transistor MGA1 and the erase gate electrode MG2 of the erase transistor MGA2, to increase a capacitance ratio, as illustrated in FIG. 7. Thus, in the memory cell 12a, even if a potential on the coupling gate line CG is reduced, a potential at an end of the channel region CH4 contacting the low-concentration impurity extension region ET2 in the memory transistor MGA1 can be increased to a similar potential to the potential on the source line SL.

In the above-mentioned configuration, when the memory transistor MGA1 is also turned on by applying a programming voltage of 6 [V] to its one end from the source line SL and applying a voltage of 0 [V] to one end of the switch transistor SGA from the bit line BL1 during data programming, and a programming voltage of 8 [V] is further applied to the coupling capacitor MGA3 from the coupling gate line CG, a voltage drop of 6 [V] occurs to generate an intense electric field in the low-concentration impurity extension region ET2 in the memory transistor MGA1 between the source line SL and the bit line BL1, and charge is injected into the floating gate FG by source side injection using the intense electric field so that data can be programmed.

(7) As to Non-Volatile Semiconductor Memory Device Including SRAM Cell

Figure 9:
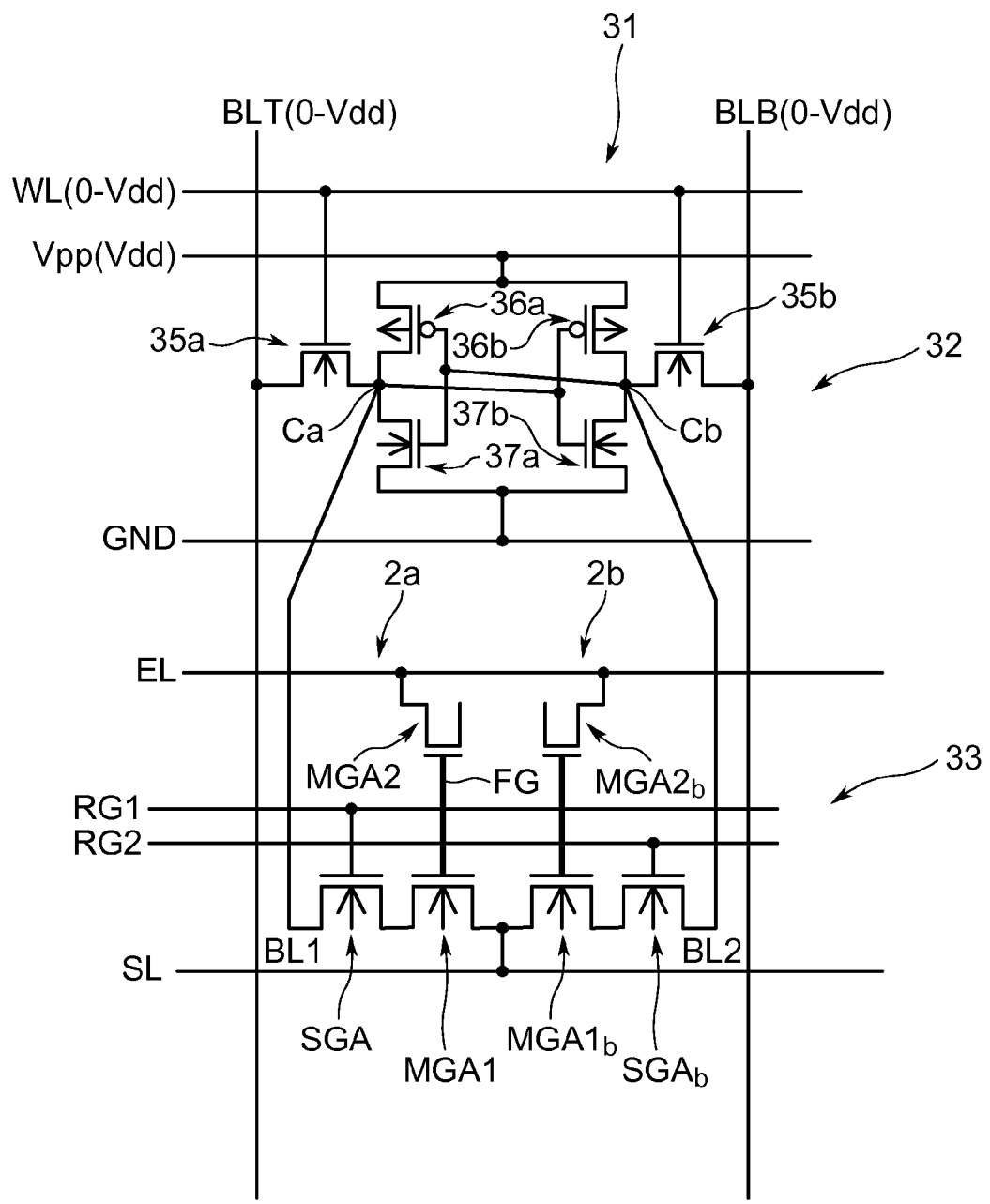
FIG. 9 is a circuit diagram illustrating a circuit configuration of a memory cell including SRAM cells.

A non-volatile semiconductor memory device, which is a combination of an SRAM (Static Random Access Memory) cell and a memory cell will be described below. FIG. 9 where portions corresponding to those illustrated in FIG. 1 are assigned the same reference numerals illustrates a non-volatile semiconductor memory device 31 according to the present invention, and the non-volatile semiconductor memory device 31 has a characteristic in that an SPAM cell 32 is connected to a non-volatile memory unit 33 including memory cells 2a and 2b. In this case, in the non-volatile memory unit 33, the memory cell 2a and the memory cell 2b constitute a complementary cell storing one bit by using two cells.

The SRAM cell 32 includes access transistors 35a and 35b composed of an N-type MOS transistor, load transistors 36a and 36b composed of a P-type MOS transistor, and drive transistors 37a and 37b composed of an N-type MOS transistor, and includes a total of six MOS transistors. The load transistor 36a (36b) has its drain connected to the drain of the drive transistor 37a (37b), its source connected to a power supply line Vpp, and its gate connected to the gate of the drive transistor 37a (37b). The drive transistor 37a (37b) has its source connected to a ground line GND.

The access transistor 35a has its drain connected to a complementary first bit line BLT, and has its source connected to a storage node Ca between the load transistor 36a and the drive transistor 37a and the respective gates of the load transistor 36b and the drive transistor 37b. On the other hand, the other access transistor 35b similarly has its drain connected to a complementary second bit line BLB, and has its source connected to a storage node Cb between the load transistor 36b and the drive transistor 37b and the respective gates of the load transistor 36a and the drive transistor 37a. Further, the access transistors 35a and 35b have their respective gates connected to a common word line WL, and a latch-type sense amplifier (not illustrated) is connected between the complementary first bit line BLT and the complementary second bit line BLB.

In addition to such a configuration, in the SRAM cell 32, a bit line BL1 in the one memory cell 2a is connected to the one storage node Ca while a bit line BL2 in the other memory cell 2b is connected to the other storage node Cb. Although the non-volatile memory unit 33 has a substantially identical configuration to that of the memory cells 2a and 2b illustrated in FIG. 1 described in the above-mentioned embodiment, individual switch gate lines RG1 and RG2 are provided for each of switch transistors SGA and SGA$_b$, and the switch transistors SGA and SGA$_b$ can be separately controlled to be turned on or off.

In the non-volatile semiconductor memory device 31, the SRAM cell 32 and the non-volatile memory unit 33 can be isolated from each other by the switch transistors SGA and SGA$_b$. Thus, the non-volatile memory unit 33 is separated by the switch transistors SGA and SGA$_b$ during a writing operation and a reading operation into the SRAM cell 32 from the outside, and can also be used as a general SRAM cell 32. The SRAM cell 32 can operate at only Vdd, and can be constructed using a normal core MOS. Thus, a fast operation can be performed.

The non-volatile semiconductor memory device 31 having such a configuration is configured to write and read data from the outside using the SRAM cell 32. During data programming into the non-volatile memory unit 33, data to be programmed to the memory cells 2a and 2b is stored in the SRAM cell 32 directly connected to the memory cells 2a and 2b. Thus, a storage destination of data need not be selected by an address or the like, and source side injection performed in the non-volatile memory unit 33 consumes little power. Thus, control of a programming potential can be performed in a mat collective manner. If power consumption is further reduced in the non-volatile semiconductor memory device 31, the power consumption can be reduced by changing a voltage to be applied to the switch gate lines RG1 and RG2, to turn on either one of the switch transistors SGA and SGA$_b$. Further, in a storage apparatus in which non-volatile semiconductor memory devices 31 are arranged in a matrix shape, power consumption during programming can also be reduced by changing a voltage to be applied to the switch gate line RG1 and the switch gate line RG2 or the switch gate line RG1 or the switch gate line RG2 in only the selected row, as needed, and reducing the number of the switch transistors SGA and SGA$_b$ to be turned on.

In the non-volatile semiconductor memory device 31, FIG. 10 illustrates respective voltage values in each of sites during programming for accepting data into the non-volatile memory unit 33 from the SRAM cell 32 (written as "programming" in FIG. 10), during data erasure in the non-volatile memory unit 33 (written as "erasure" in FIG. 10), during data loading for accepting data again into the SRAM cell 32 from the non-volatile memory unit 33 (written as "data loading" in FIG. 10), during data writing into the SRAM cell 32 (written as "writing" in FIG. 10), during data reading from the SRAM cell 32 (written as "reading" in FIG. 10), and during Vth monitoring of the memory cell 2a or the memory cell 2b (written as "Vth monitor loading" in FIG. 10). In FIG. 10, the site that can be set to any voltage value is written as "Don't care".

The memory cell 2a and the memory cell 2b constitute a complementary cell storing one bit by using two cells. When both the switch transistors SGA and SGA$_b$ are turned on, therefore, a potential on the bit line on the complementary side changes depending on a state of the cell on the complementary side. Thus, a latch circuit (not illustrated) brings the bit line BL1 on which a voltage more early drops into "1" while forcedly bringing the other bit line BL2 into "0", for example. Thus, normal monitoring of Vth of each of memory transistors MGA1 and MGA1$_b$ cannot be performed.

Therefore, in the present invention, as illustrated in FIG. 9, in the memory cells 2a and 2b constituting the complementary cell, the switch gate lines RG1 and RG2 are provided for each of the switch transistors SGA and SGA$_b$, the switch transistors SGA and SGA$_b$ are individually turned on or off, and Vth of each of the memory transistors MGA1 and MGA1$_b$ in the memory cell 2a and the memory cell 2b can be individually monitored.

(7-1) Data Writing into SRAM Cell

In this case, in data writing into the SRAM cell 32, a predetermined voltage of Vdd is applied to the word line WL, and both the access transistors 35a and 35b connected to the word line WL are turned on. In this case, a predetermined voltage of Vdd can also be applied to the power supply line Vpp. In the SRAM cell 32, when Vdd is applied as a writing voltage into the one complementary first bit line BLT, 0 [V] can be applied as a writing inhibition voltage to the other complementary second bit line BLB, for example.

Thus, each of the one load transistor 36a and the one drive transistor 37a has its gate electrically connected to the complementary second bit line BLB via the other access transistor 35b so that 0 [V] is applied to the gate. As a result, the load transistor 36a is turned on while the drive transistor 37a is turned off. Thus, the storage node Ca between the load transistor 36a and the drive transistor 37a is electrically connected to the power supply line Vpp via the load transistor 36a so that a voltage becomes high ("1").

At this time, each of the other load transistor 36b and the other drive transistor 37b has its gate electrically connected to the complementary first bit line BLT via the one access transistor 35a so that Vdd is applied to the gate. As a result, the load transistor 36b is turned off while the drive transistor 37b is turned on. Thus, the storage node Cb between the load transistor 36b and the drive transistor 37b is electrically connected to the ground line GND via the drive transistor 37b so that a voltage becomes low ("0"). Consequently, the SRAM cell 32 enters a state where data is written.

(7-2) Data Reading from SRAM Cell

When data in the SRAM cell 32 is read out, a predetermined voltage of Vdd is applied to the word line WL, to turn on both the access transistors 35a and 35b connected to the word line WL. Thus, in the non-volatile semiconductor memory device 31, a potential at the one storage node Ca is read out via the complementary first bit line BLT while a potential at the other storage node Cb is read out via the complementary second bit line BLB so that a sense amplifier can determine whether data recorded in each of the storage nodes Ca and Cb is "0" or "1".

(7-3) Programming into Non-Volatile Memory Unit

In the present invention, the data, which has been recorded in the SRAM cell 32, as described above, can be accepted into the non-volatile memory unit 33 in mat collective processing based on the above-mentioned principle "(2) Data Programming Operation". In the description, the SRAM cell 32 is in a state where the potential at the one storage node Ca is high and is in a state where the potential at the other storage node Cb is low.

In this case, in the non-volatile memory unit 33, each of the switch transistors SGA and $SGA_b$ is turned on by applying 0 [V] to an erase line EL, applying 6 [V] to a source line SL, and applying Vdd to each of the switch gate lines RG1 and RG2. In the non-volatile memory unit 33, the switch transistor SGA in the memory cell 2a is electrically connected to the one storage node Ca into which data is programmed via the one bit line BL1. Thus, a potential at one end of the switch transistor SGA becomes the same high potential as that at the storage node Ca. Thus, in the memory transistor MGA1, a potential difference between its parts on the side of the switch transistor SGA and the side of the source line SL becomes small. Therefore, an intense electric field is not generated so that no charge can be injected into the floating gate FG.

On the other hand, in the non-volatile memory unit 33, the switch transistor $SGA_b$ in the other memory cell 2b is electrically connected to the other storage node Cb to which no data is programmed via the other bit line BL2. Thus, a potential at one end of the switch transistor $SGA_b$ becomes the same low potential as that at the storage node Cb. Thus, in the memory transistor $MGA1_b$, a potential difference between its parts on the side of the switch transistor $SGA_b$ and the side of the source line SL becomes large. Therefore, an intense electric field is generated so that charge can be injected into the floating gate FG.

Thus, in the non-volatile semiconductor memory device 31, the data recorded in the SRAM cell 32 can be accepted into the non-volatile memory unit 33 by mat collective processing. Therefore, control of a peripheral circuit can also be simplified.

(7-4) Data Loading from Non-Volatile Memory Unit

In the present invention, the data, which has been accepted into the non-volatile memory unit 33 once, as described above, can be written into the SRAM cell 32 again by mat collective processing based on the above-mentioned principle "(3) Data Reading Operation". The non-volatile memory unit 33 is in a state where charge is stored in the floating gate FG in the memory cell 2b so that data is programmed and is in a state where no charge is stored in the floating gate FG in the memory cell 2a so that no data is programmed. In this case, no data is programmed to the storage nodes Ca and Cb.

In this case, in the SRAM cell 32, 0 [V] is applied to the word line WL so that the access transistors 35a and 35b are turned off. In the non-volatile memory unit 33, each of the switch transistors SGA and $SGA_b$ is turned on by applying 0 [V] to the erase line EL, applying 3 [V] to the source line SL, and further applying Vdd to each of the switch gate lines RG1 and RG2.

Thus, the non-volatile memory unit 33 can be restored to a state ("1") where data is programmed by electrically connecting the memory transistor MGA1 and the bit line BL1 to each other and making a potential at the one storage node Ca in the SRAM cell 32 high with a high potential at the floating gate FG (a state where no electrons are stored).

The non-volatile memory unit 33 can be restored to a state ("0") where no data is programmed by also electrically connecting the memory transistor $MGA_b$, and the bit line BL2 to each other and making a potential at the other storage node Cb in the SRAM cell 32 low with a low potential at the floating gate FG (a state where electrons are stored). Further, in the non-volatile memory unit 33, data can be loaded into the SRAM cell 32 by mat collective processing. Therefore, control of a peripheral circuit can also be simplified.

(7-5) Data Erasure in Non-Volatile Memory Unit

Furthermore, in the present invention, data can also be erased in the non-volatile memory unit 33 based on the above-mentioned principle "(4) Data Erasure operation". In this case, in the non-volatile memory unit 33, an erasure voltage of 7 [V] can be applied to the erase line EL, and 0 [V] can be applied to the source line SL and the switch gate lines RG1 and RG2. In the non-volatile memory unit 33, when a high electric field is applied to only the gate electrodes of the erase transistors MGA2 and $MGA2_b$, connected to the erase line EL, charge in the floating gates FG are respectively ejected using channel layers of the erase transistors MGA2 and $MGA2_b$, and the data in the non-volatile memory unit 33 can be erased by mat collective processing.

(7-6) Case where Only One Memory Cell is Provided in Non-Volatile Memory Unit

In the above-mentioned embodiment, a case where the two memory cells 2a and 2b are provided as a complementary cell storing one bit by using two cells in the complementary non-volatile semiconductor memory device 31 has been described. However, the present invention is not limited to this. In the complementary non-volatile semiconductor memory device, only the one memory cell 2a, for example, may be provided. In FIG. 9, description is made, assuming that the other memory cell 2b is not provided but only the one memory cell 2a is provided.

When the SRAM cell 32 is in a state where a potential at the one storage node Ca is high and is in a state where a potential at the other storage node Cb is low, for example, programming into the non-volatile memory unit 33 is performed in the following manner. In the non-volatile memory unit 33 in which only the one memory cell 2a is provided, the switch transistor SGA is turned on by applying 0 [V] to an erase line EL, applying 6 [V] to a source line SL, and further applying Vdd to the switch gate line RG1.

In the non-volatile memory unit 33, the switch transistor SGA in the memory cell 2a is electrically connected to the one storage node Ca into which data is programmed via the one bit line BL1. Thus, a potential at the one end of the switch transistor SGA becomes the same high potential as that at the storage node Ca. Thus, in the memory transistor, a potential difference between its parts on the side of the switch transistor SGA and the side of the source line SL becomes small. Therefore, no intense electric field is generated so that no charge can be injected into the floating gate FG. Thus, in the non-volatile memory unit 33, data recorded in the SRAM cell 32 is accepted into only the one memory cell 2a.

Data loading into the SRAM cell 32 from the non-volatile memory unit 33 that has thus accepted data will be described below. In this case, the memory cell 2a is in a state where no charge is stored in the floating gate FG so that no data is programmed, and no data is programmed to the storage nodes Ca and Cb.

In this case, in the SRAM cell 32, the access transistors 35a and 35b are turned off by applying 0 [V] to the word line WL. In the non-volatile memory unit 33, the switch transistor SGA is turned on by applying 0 [V] to the erase line EL, applying 3 [V] to the source line SL, and further applying Vdd to the switch gate line RG1.

Thus, the memory cell 2a can be restored to a state ("1") where data is programmed by electrically connecting the memory transistor MGA1 and the bit line BL1 to each other and making a potential at the one storage node Ca in the SRAM cell 32 high with a high potential at the floating gate FG (a state where no electrons are stored). In this case, a potential at the storage node Ca in the SRAM cell 32 is high. When the load transistor 36a connected to the storage node Ca is turned off while the drive transistor 37b is turned on, therefore, the memory cell 2a can be restored to a state ("0") where no data is programmed to the storage node Cb by connecting the storage node Cb to the ground line GND and making a potential at the storage node Cb low.

Thus, in the complementary non-volatile semiconductor memory device, if a state where data is programmed is determined for the one storage node Ca in the SRAM cell 32, a state where data is programmed is also determined for the other storage node Cb. Therefore, data can be loaded into the SRAM cell 32 only by the one memory cell 2a provided in the non-volatile memory unit 33. Thus, a circuit configuration can be further simplified because the other memory cell 2b is not provided.

The present invention is not limited to the present embodiment. Various modifications can be implemented without departing from the scope of the present invention. In the memory cell according to another embodiment illustrated in FIG. 8, for example, a deplete-type channel region CH1 and an enhancement-type channel region CH2 as illustrated in FIG. 3 may be formed on the channel layer of the memory transistor MGA1.

While a case where the non-volatile memory unit 33 to which the memory cells 2a and 2b illustrated in FIG. 1 are applied is provided in the non-volatile semiconductor memory device 31 illustrated in FIG. 9 has been described, the present invention is not limited to this. A non-volatile memory unit to which the memory cells 12a and 12b each including the coupling capacitor MGA3 illustrated in FIG. 6 are applied may be provided.

While the respective voltage values during data programming or writing, data erasure, data reading, and the like are respectively clearly written in FIGS. 1, 3 to 6, and 8 to 10, the present invention is not limited to these. Various voltage values may be applied. While a case where a voltage of 1.5 [V] is applied to the bit lines BL1 and BL2 and the word lines WL1 and WL2 to control the switch transistor SGA to be turned on or off has been described in the above-mentioned embodiment, for example, the present invention is not limited to this. The switch transistor SGA can be controlled to be turned on or off. Even if 1.2 [V] is applied to the bit lines BL1 and BL2 and the word lines WL1 and WL2, a core MOS for 1.2 [V](1.2 V-MOS) can be used as the switch transistor SGA.

Furthermore, while a case where the erase transistor MGA2 is formed in a P-type second active region and the memory transistor MGA1 and the switch transistor SGA are formed in a P-type first active region has been descried in the above-mentioned embodiment, the present invention is not limited to this. The erase transistor MGA2 may be formed in the N-type second active region, and the memory transistor MGA1 and the switch transistor SGA may be formed in the N-type first active region. Alternatively, the coupling capacitor MGA3 illustrated in FIG. 7 may be formed in the P-type third active region.

While a case where the memory cell 2a includes the erase transistor MGA2 and the data in the memory cell 2a can be erased has been described in the above-mentioned embodiments, the present invention is not limited to this. For example, the memory cell 2a may be a memory cell including only the switch transistor SGA and the memory transistor MGA1 without providing the erase transistor MGA2. The non-volatile semiconductor memory device including such a memory cell can be a non-volatile device capable of programming into the memory transistor MGA1 only once.

Figure 11:
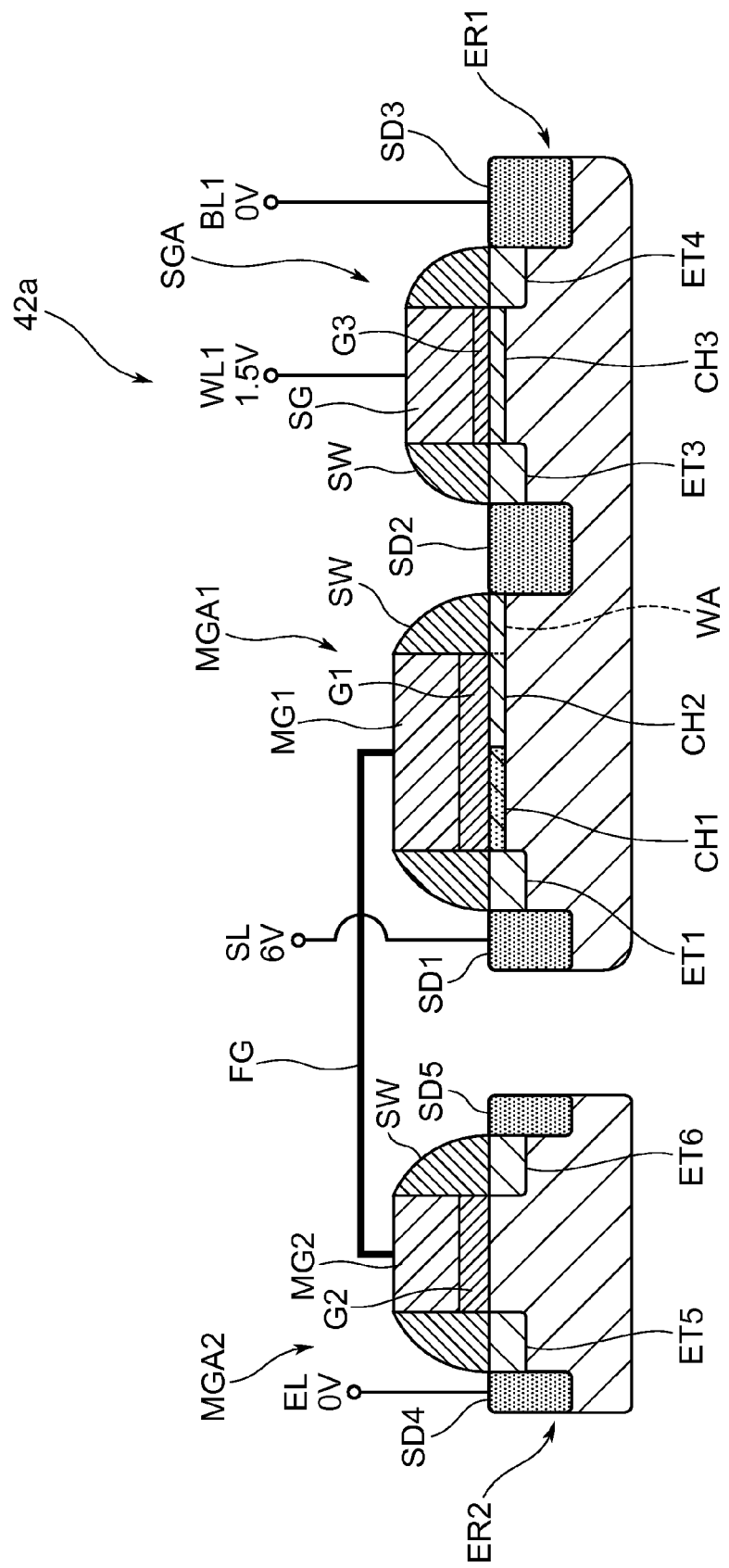
FIG. 11 is a sectional side elevation illustrating a cross-section structure of a non-volatile semiconductor memory device according to another embodiment.

(8) Memory Cell Including High-Resistance Region without Providing Low-Concentration Impurity Extension Region While a case where the low-concentration impurity extension region ET2 is provided as a high-resistance region between the region below the floating gate FG and the source-drain region SD2 at the other end electrically connected to the switch transistor SGA has been described in the above-mentioned embodiments, the present invention is not limited to this. If a data reading operation can be performed in a memory cell, a part of a channel region CH2 between a region below a floating gate FG and a source-drain region SD2 at the other end may be a high-resistance region WA by not providing a low-concentration impurity extension region ET2 between the region below the floating gate FG and the source-drain region SD2 at the other end and directly forming an enhancement-type channel region CH2 to the source-drain region SD2 in a memory cell 42a, as illustrated in FIG. 11 where portions corresponding to those illustrated in FIG. 3 are assigned the same reference numeral.

When even the memory cell 42a having such a configuration is turned on by applying a programming voltage of 6 [V] to one end of a memory transistor MGA1 from a source line SL and applying 0 [V] to one end of the switch transistor SGA from a bit line BL1 during data programming, in the memory transistor MGA1, a voltage drop of 6 [V] occurs to generate an intense electric field in a high-resistance region WA on the side adjacent to the switch transistor SGA and data can be programmed by so-called source side injection for injecting charge into the floating gate FG using this intense electric field like in the above-mentioned embodiment.

Even if the channel region CH2 extending to a region below a sidewall SW is provided, the impurity concentration of the channel region CH2 is desirably 1 E 18/cm$^3$ or less.

A configuration in which the channel region is formed to the source-drain region SD2 without providing the low-concentration impurity extension region ET2 and the channel region in the region below the sidewall SW is the high-resistance region WA can also be applied in the memory transistor MGA1 illustrated in FIG. 8. In this case, the memory transistor MGA1 can have a configuration in which the channel region CH4 directly extends to the source-drain region SD2.

The other memory transistor MGA1 may have a configuration in which a deplete-type channel region CH1 is directly formed to a source-drain region SD1 without providing the extension region ET1 at one end, like at the other end, in addition to a configuration in which the channel region CH2 is formed to the source-drain region SD2 from the region below the floating gate FG, as described above.

A part of a deplete-type channel region between the region below the floating gate FG and the source-drain region SD2 at the other end may be a high-resistance region WA by forming the channel region CH2 as not an enhance-type channel region but a deplete-type channel region and directly forming the deplete-type channel region to the source-drain region SD2.

At this time, a resistance value of the high-resistance region WA can be made higher than the resistance value of the extension region ET1 at the one end when the extension region ET1 is formed. Even when the deplete-type channel region CH1 is directly formed to the source-drain region SD1 from the region below the floating gate FG without providing the extension region ET1 at the one end, a resistance value of a deplete-type channel region between the region below the floating gate FG and the source-drain region SD2 can be made higher than the resistance value of the deplete-type channel region CH1 at the one end.

REFERENCE SIGNS LIST 1, 11, 31 NON-VOLATILE SEMICONDUCTOR MEMORY DEVICE
2a, 2b, 2c, 2d MEMORY CELL
BL1, BL2 BIT LINE
CH1 DEPLETE-TYPE CHANNEL REGION
ET1, ET3, ET4, ET5, ET6 EXTENSION REGION
ET2 LOW-CONCENTRATION IMPURITY EXTENSION REGION (HIGH-RESISTANCE REGION)
FG FLOATING GATE
MGA1 MEMORY TRANSISTOR
MGA2 ERASE TRANSISTOR
MGA3 COUPLING CAPACITOR
MG1 GATE ELECTRODE
SGA SWITCH TRANSISTOR
SG SWITCH GATE ELECTRODE
SL SOURCE LINE
WL1, WL2 WORD LINE
WA HIGH-RESISTANCE REGION

What is claimed is:

1. A non-volatile semiconductor memory device comprising a memory cell including a memory transistor having a single-layer gate structure having a floating gate and a switch transistor having a single-layer gate structure having a switch gate electrode, wherein
the memory cell has a configuration in which a source line is connected to one end of the memory transistor, a bit line is connected to one end of the switch transistor, and the other end of the memory transistor and the other end of the switch transistor are electrically connected in series to each other, and
the memory transistor includes: a high-resistance region between a region below the floating gate and a source-drain region at the other end, wherein a resistance value of the high-resistance region is higher than a resistance value between the region below the floating gate and a source-drain region at the one end; and
extension regions respectively formed on both sides of the region below the floating gate, wherein a low-concentration impurity extension region having a lower impurity concentration than that of the extension region at the one end is formed as the high-resistance region.

2. The non-volatile semiconductor memory device according to claim 1, wherein
a deplete-type channel region is formed in contact with at least one of the extension regions on an upper surface of an active region below the floating gate.

3. The non-volatile semiconductor memory device according to claim 2, wherein
an enhancement-type channel region having both its ends contacting the deplete-type channel region and the low-concentration impurity extension region is formed on an upper surface of the active region below the floating gate.

4. The non-volatile semiconductor memory device according to claim 1, wherein
the memory cell further including a coupling capacitor that adjusts a potential at the floating gate,
wherein the coupling capacitor is formed in an active region formed separately from another active region in which the memory transistor is formed, and the floating gate extends in the memory transistor and the coupling capacitor.

5. The non-volatile semiconductor memory device according to claim 1, wherein in the switch transistor,
the film thickness of a gate oxide film formed below the switch gate electrode is smaller than the film thickness of a gate oxide film formed below the floating gate of the memory transistor.

6. The non-volatile semiconductor memory device according to claim 1, wherein
the memory cell further including an erase transistor that ejects charge from the floating gate,
wherein the erase transistor is formed in an active region formed separately from another active region in which the memory transistor is formed, and the floating gate extends in the memory transistor and the erase transistor.

7. The non-volatile semiconductor memory device according to claim 6, wherein the floating gate has a region thereof which opposes the memory transistor, formed as an N type floating gate and has a region thereof which opposes the erase transistor, formed as a P type floating gate.

8. The non-volatile semiconductor memory device according to claim 1, wherein
the memory cells are arranged in a matrix shape, and
the source line uniformly applies a voltage common to the memory transistors provided for the respective memory cells.

9. The non-volatile semiconductor memory device according to claim 1, wherein
an SRAM cell and the one memory cell and the other memory cell constitute one bit, and
one bit line connected to the one memory cell is connected to one storage node in the SRAM cell, and the other bit line connected to the other memory cell is connected to the other storage node complementary to the one storage node in the SRAM cell.

10. The non-volatile semiconductor memory device according to claim 9, wherein
gate lines are individually connected to the switch transistors provided for the respective memory cells, and the switch transistors are independently controlled to be turned on or off.

11. The non-volatile semiconductor memory device according to claim 1, wherein
the high-resistance region has an impurity doping amount of $1E18/cm^3$ or less.

* * * * *